(12) United States Patent
Buhlman et al.

(10) Patent No.: US 10,199,773 B2
(45) Date of Patent: Feb. 5, 2019

(54) SYSTEMS AND METHODS FOR AUTOMATIC DETECTION OF MISCONNECTED CABLES

(71) Applicant: Oracle International Corporation, Redwood Shores, CA (US)

(72) Inventors: Craig A. Buhlman, Boulder, CO (US); Steven C. Fraioli, Arvada, CO (US); Adam W. Mehlberg, Loveland, CO (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/643,195

(22) Filed: Jul. 6, 2017

(65) Prior Publication Data

US 2019/0013621 A1    Jan. 10, 2019

(51) Int. Cl.
| | | |
|---|---|---|
| *H01R 13/641* | (2006.01) |
| *G01R 31/02* | (2006.01) |
| *H01R 13/66* | (2006.01) |
| *H01R 13/717* | (2006.01) |
| *H01R 13/71* | (2006.01) |

(52) U.S. Cl.
CPC ......... *H01R 13/641* (2013.01); *G01R 31/021* (2013.01); *H01R 13/6683* (2013.01); *H01R 13/6691* (2013.01); *H01R 13/717* (2013.01)

(58) Field of Classification Search
CPC .............. H01R 13/641; H01R 13/6683; H01R 13/6691; H01R 13/717; G01R 31/021
USPC .................................................. 340/686.4
See application file for complete search history.

(56) References Cited

U.S. PATENT DOCUMENTS

| | | | | |
|---|---|---|---|---|
| H1369 H | * | 11/1994 | Verbin ..................... | H04B 3/46 324/133 |
| 9,847,928 B2 | * | 12/2017 | Tingle .................. | H04L 43/0811 |
| 2003/0141875 A1 | * | 7/2003 | Seymour .............. | G01R 31/021 324/525 |
| 2007/0223369 A1 | * | 9/2007 | Uekusa ................ | G01R 31/043 370/217 |
| 2013/0049767 A1 | * | 2/2013 | King .................... | G01R 31/021 324/605 |
| 2013/0242760 A1 | * | 9/2013 | Peyton .................. | H04Q 1/136 370/250 |
| 2016/0127313 A1 | * | 5/2016 | Balasubramanian ....... | H04L 41/0631 709/220 |

* cited by examiner

*Primary Examiner* — Jack K Wang
(74) *Attorney, Agent, or Firm* — Invoke

(57) ABSTRACT

Systems and methods for automatic detection of misconnected cables are described herein. In one or more embodiments, a test circuit sends a signal through a first pin of a first connector that is coupled to a first cable of a plurality of cables. The test circuit monitors a second pin of a second connector that is coupled to a second cable of the plurality of cables to determine whether the signal is detected on the second pin of the second connector. Responsive to determining that the signal is not detected on the second pin, an alert signal is generated to indicate that at least one cable of the plurality of cables is misconnected.

18 Claims, 9 Drawing Sheets

SYSTEMS AND METHODS FOR AUTOMATIC DETECTION OF MISCONNECTED CABLES

TECHNICAL FIELD

The present disclosure relates to techniques for detecting miss-connected cables in electrical and computing systems.

BACKGROUND

Systems with multiple cable connections may experience varying problems if the incorrect cable is plugged into a connector. To prevent misconnections, one approach is to use different-sized connectors for different cables. Another approach is to physically restrain the cables from reaching the wrong connector. These approaches both prevent cables from physically coupling with the wrong connectors. However, the approaches may add to the cost and complexity of a design. In systems with dozens or more cables, providing a unique connector for each cable may be infeasible. Physically restraining the cables further limits the overall layout and may increase the footprint of the design.

Misconnection problems may also arise if a cable is not fully mated to a connector. To help ensure that cables are fully mated, one approach is to include latches on connectors. A latch, in this context, is a mechanism that clicks or otherwise provides feedback when the connection is fully mated. Latches generally add to the cost and complexity of a connector design and, in many cases, are not completely foolproof. For example, the audible feedback provided by a latch may not be easily heard in a noisy environment. In addition, latches generally do not prevent cables from being swapped into the wrong connectors.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings.

DETAILED DESCRIPTION

Figure 1A:
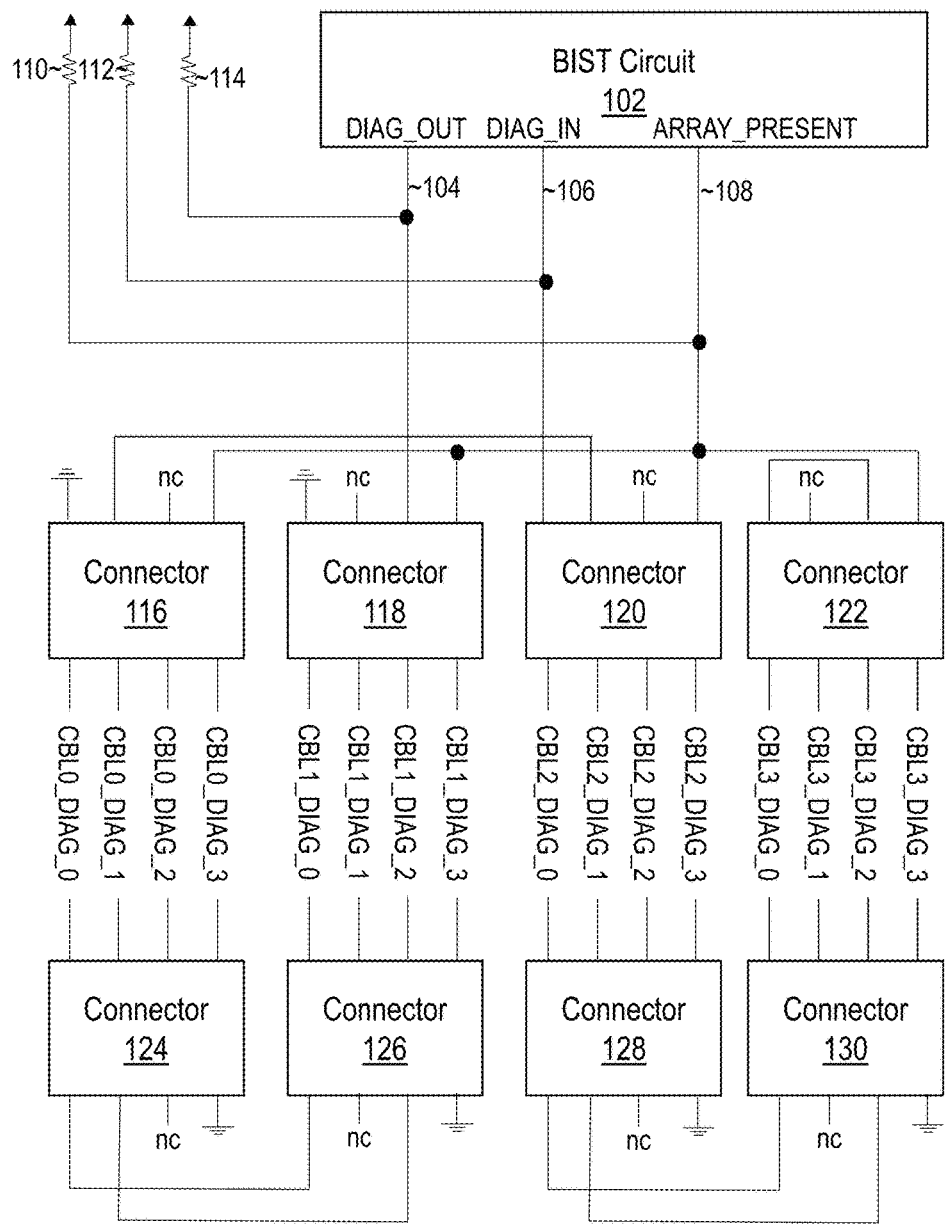
FIG. 1A illustrates a system for automatically detecting misconnected cables in a four-cable arrangement according to one or more embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. ARCHITECTURAL ARRANGEMENTS
3. DIAGNOSTIC TEST PROCESS
4. EXAMPLE MISCONNECTIONS
5. HARDWARE OVERVIEW
6. MISCELLANEOUS; EXTENSIONS

1. General Overview

Systems and methods are described herein for automatically detecting misconnected cables. In one or more embodiments, the systems and methods route a diagnostic signal back and forth through multiple cables to detect if any cable is not properly connected or if connections at either end have been swapped. If a misconnection is detected, then an alert signal may be generated to provide feedback that there is a problem.

In one or more embodiments, the system cables and connectors include a set of one or more pins that are used to perform a diagnostic test. During the test, a diagnostic signal is sent through a pin of a first connector that is coupled to a first cable of a plurality of cables. The diagnostic signal is routed through each of the plurality of cables until the signal returns to a pin of another connector. If the return signal does not match the sent diagnostic signal, then the system may determine there is a faulty connection and raise an alert.

In one or more embodiments, the set of one or more pins that are used to perform the diagnostic test are selectively grounded such that disconnected cables or swapped connections result in a return signal that is stuck high or low. The diagnostic signal may first drive the pin of the first connect low and then high (or vice versa) to determine whether a corresponding change is detected on the return signal. If the return signal remains high or low, then the system may determine that one or more cables are misconnected and generate an alert.

In one or more embodiments, visual feedback is provided to the user based on the results of the diagnostic test. If an alert is generated, an indicator light may be illuminated (e.g., red or any other color), an alert message may be displayed on a panel, and/or some other visual indicator may be presented to the user. Additionally or alternatively, visual feedback may be presented when a correct connection is detected. For instance, the indicator light may be illuminated a different color (e.g., green or any other color), a "connection successful" message may be displayed on a panel, and/or some other visual indicator that the cables were correctly coupled may be presented. The visual feedback may be provided nearly instantaneously once the cables are coupled. This allows for cables to be checked in real-time as the system is being assembled, which may improve manufacturing installation times and fault isolation times. For example, large-scale machines may have dozens or even hundreds of cables. The size and complexity of such large-scale may make the task of isolating misconnected cables difficult. The diagnostic test may be run on subsets of cables before the machine is fully assembled, allowing corrections to be performed early on and before the full assembly makes such corrections difficult.

2. Architectural Arrangements

The techniques for performing diagnostic cable testing, as described further herein, may be applied to various electrical and computer systems that have multiple cable connections. Example systems may include, but are not limited to, server appliances, tape libraries, workstations, routers, and communication endpoints. The design and arrangement of a diagnostic test circuit may vary between different systems and may depend, in part, on the number and types of cables being tested.

Figure 1B:
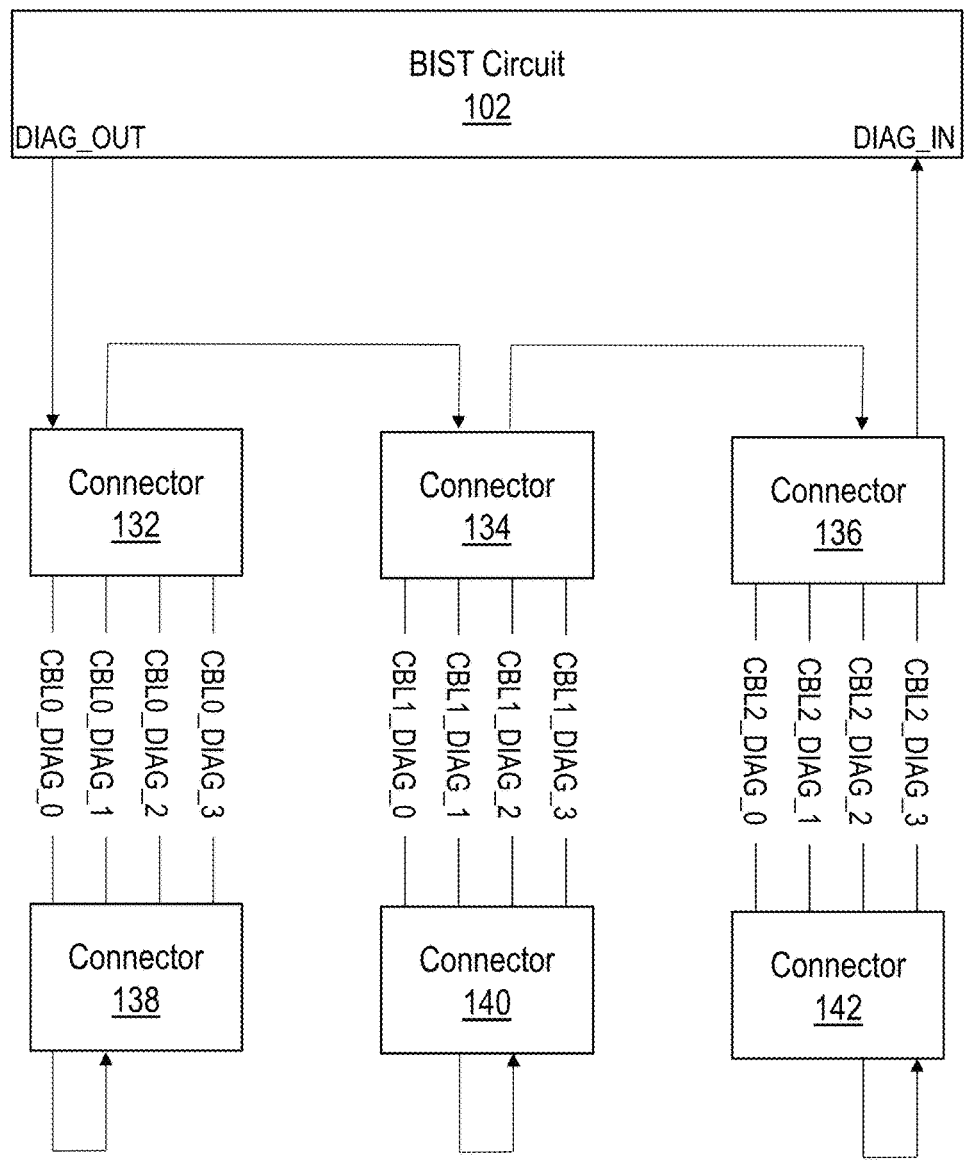
FIG. 1B illustrates a system for automatically detecting misconnected cables in a three-cable arrangement according to one or more embodiments.
Figure 1C:
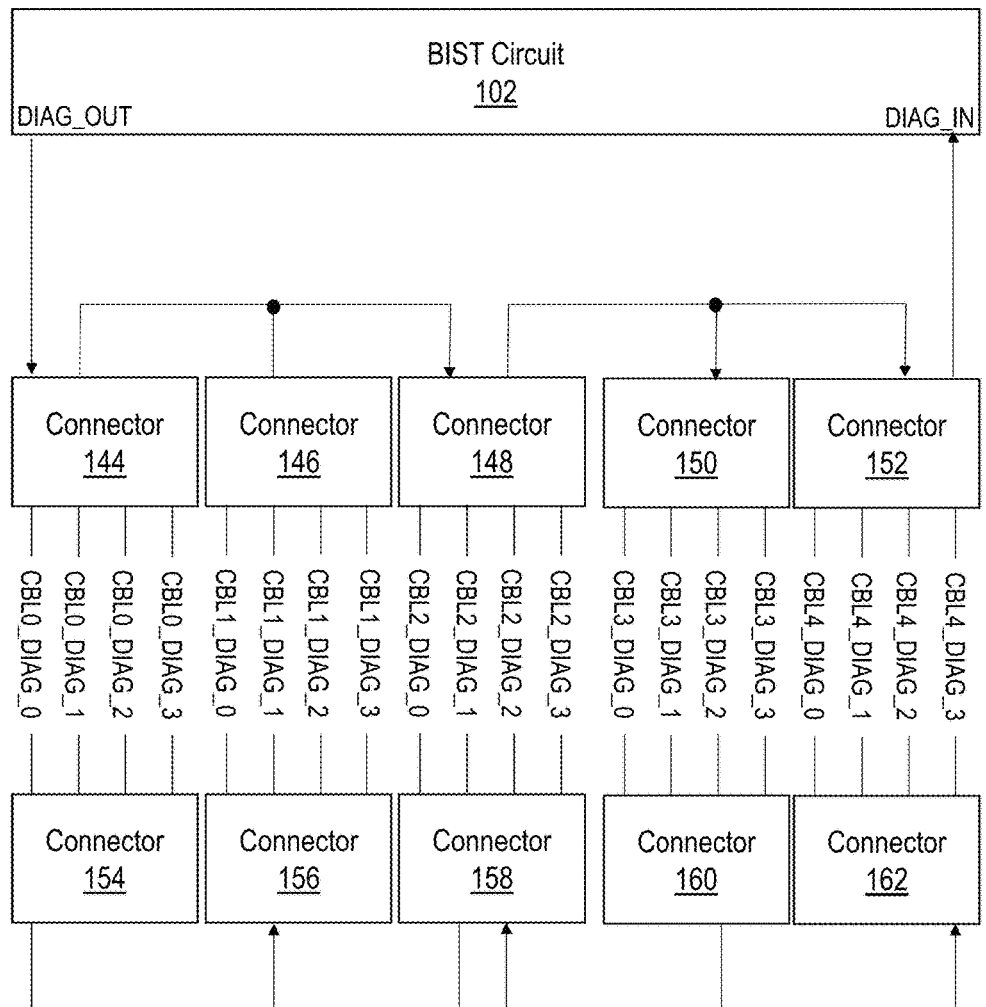
FIG. 1C illustrates a system for automatically detecting misconnected cables in a five-cable arrangement according to one or more embodiments.

The diagnostic test may be performed on any system comprising two or more cables. FIGS. 1A-1C illustrate different arrangements for systems having different numbers of cables. For example, FIG. 1A illustrates a system for automatically detecting misconnected cables in a four-cable arrangement according to one or more embodiments. The system includes built-in self-test (BIST) circuit 102 for performing the diagnostic test. BIST circuit 102 may be a hardware circuit or may be implemented in software executed on a microprocessor, depending on the implementation. BIST circuit 102 comprises (a) output signal DIAG_OUT for sending diagnostic signals, (b) input signal DIAG_IN for monitoring a result signal, and (c) input signal ARRAY_PRESENT for detecting when cables have been plugged in to the corresponding connectors.

Referring still to FIG. 1A, eight connectors are used to connect the four cables. Connector 116 and connector 124 are coupled to a cable denoted CBL0, connector 118 and connector 126 connect cable CBL1, connector 120 and 128 connect cable CBL2, and connector 122 and 130 connect cable CBL3. Each connector and cable comprises four pins that are used to perform the diagnostic test. For example, cable CBL0 includes traces CBL0_DIAG_0, CBL0_DIAG_1, CBL0_DIAG_2, CBL0_DIAG_3 which connect corresponding pins of connectors 116 and 124. Similarly, CBL1 includes CBL1_DIAG_0, CBL1_DIAG_1, CBL1_DIAG_2, CBL1_DIAG_3; CBL2 includes CBL2_DIAG_0, CBL2_DIAG_1, CBL2_DIAG_2, CBL2_DIAG_3; and CBL3 includes CBL3_DIAG_0, CBL3_DIAG_1, CBL3_DIAG_2, CBL3_DIAG_3.

In one or more embodiments, each cable may include more than four traces/pins. For example, serial-attached small computer system interface (SCSI) may have twenty-six or more pins. Parallel SCSI and other forms of cables may also be more than four bits in width. The system may reserve any four of the pins for performing the diagnostic test. The other pins may be used to transfer data, power, and/or other signals In one or more embodiments, fewer than four pins may be reserved for the diagnostic test. For example, the pins that are coupled to the input signal ARRAY_PRESENT may be omitted. In this case, the diagnostic test may be triggered externally, such as by the push of a button or through software, rather than upon detection of the presence of cables.

The output signal DIAG_OUT from BIST circuit 102 is coupled to the pin for CBL1_DIAG2 connector 118 by conductive trace 104. Pull-up resistor 114 has one terminal that is electrically coupled to conductive trace 104 and one terminal that is coupled to a direct current (DC) power source. BIST circuit 102 may use pull-up resistor 114 to selectively drive the output signal DIAG_OUT high or low.

Input signal DIAG_IN is electrically coupled to the pin for CBL2_DIAG_0 by conductive trace 106. Pull up-resistor 112 is also electrically coupled to conductive trace 106 and may drive the input signal high if a cable is misconnected.

Input signal ARRAY_PRESENT is coupled to pins for CBL0_DIAG_3, CBL1_DIAG_3, CBL2_DIAG_3, CBL3_DIAG_3. Input signal ARRAY_PRESENT is further coupled to pull-up resistor 110. Thus, the input signal is driven high or low depending on whether the cables have been coupled to the connectors. BIST circuit 102 may automatically start the diagnostic test upon detecting that the cables have been coupled to the connectors.

When the cables are correctly coupled, the diagnostic signal is sent over conductive trace 104 through connector 118 over CBL1_DIAG_2. The signal passes through connector 126 and is routed back through connector 124 over CBL0_DIAG_1 to connector 116. The signal continues through connector 120 over CBL2_DIAG_1, through connectors 128 and 130, back through CBL3_DIAG_2 to connector 122, wrapping back through connector 122 onto CBL3_DIAG_0, through connectors 130 and 128, and finally through CBL2_DIAG_0 to connector 120. The return signal flows from connector 120 over conductive trace 106 to BIST circuit 102. Thus, the diagnostic signal may be routed through each of the connectors and cables within a grouping before the signal returns to the point of origin. In other words, the diagnostic signal is sent over a starting pin of a cable in the group, traverses each of the other cables/connectors in the group, and returns over the pin of a different cable.

Various connector pins are grounded or not connected. For connector 116, for instance, the pin for CBL0_DIAG_0 is connected to ground, and the pin for CBL0_DIAG_2 is not connected. Other connectors also have pins that are either grounded or not connected as illustrated. The grounded pins drive and keep the return signal low in case of a misconnection. The pins that are not connected drive and keep the return signal high.

The path of the diagnostic signal may vary for different arrangements. FIG. 1B illustrates a system for automatically detecting misconnected cables in a three-cable arrangement according to one or more embodiments. In this case BIST circuit 102 sends the diagnostic signal through connector 132 over the pin for CBL0_DIAG_0. The signal passes through connector 138, back through connector 138 over CBL0_DIAG_1 to connector 132, through connector 134 over CBL1_DIAG_1 to connector 140, back through connector 140 over CBL1_DIAG_2 to connector 134, through connector 136 over CBL2_DIAG_2 to connector 142, back through connector 142 over CBL2_DIAG_3 to connector 136, and back to BIST circuit 102. Thus, the diagnostic signal passes through each of the three cables and back to the point of origin.

FIG. 1C illustrates a system for automatically detecting misconnected cables in a five-cable arrangement according to one or more embodiments. In this case BIST circuit 102 sends the diagnostic signal through connector 144, over the pin for CBL0_DIAG_0. The signal passes through connector 154, back through connector 156 over CBL1_DIAG_1 to connector 146, through connector 148 over CBL2_DIAG_1 to connector 158, back through connector 158 over CBL2_DIAG_2 to connector 148, through connector 150 over CBL3_DIAG_2 to connector 160, back through connector 162 over CBL4_DIAG_3 to connector 152, and back to BIST circuit 102. Thus, the diagnostic signal passes through each of the five cables and back to the point of origin.

In other embodiments, BIST circuit 102 may be used to test systems with more than five cables. One or more pins on each connector may be reserved to route the diagnostic signal from one cable to the next until the signal returns to BIST circuit 102. Other pins may be connected to ground or left open to pull the return signal high or low in the event of a misconnection. If the return signal does not match the diagnostic signal, then BIST circuit 102 may determine that the cables are not properly connected.

Figure 2:
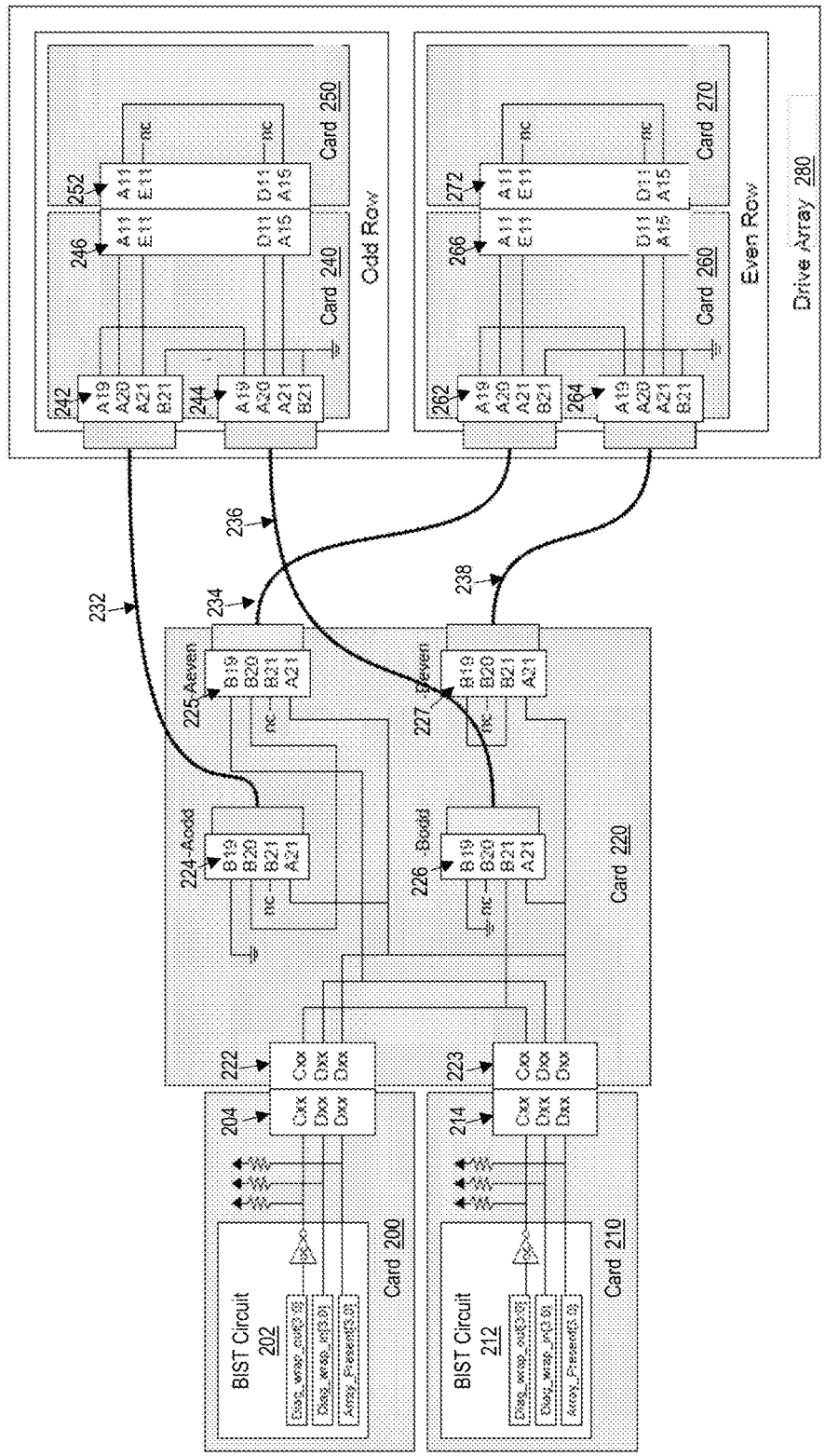
FIG. 2 illustrates an example system arrangement for testing cable connections in a drive array according to one or more embodiments.

In one or more embodiments, multiple test circuits may be deployed within a system to provided redundancy. For example, FIG. 2 illustrates an example system arrangement for testing cable connections in a drive array according to one or more embodiments. In this example, a set of test circuits are used to test the connections between a server system and drive array 280.

The server system comprises card 200 and card 210, which both include built-in test circuits to provide redundancy. Card 200 comprises BIST circuit 202, and card 210 comprises BIST circuit 212. Card 200 further comprises connector 204, which is coupled to connector 222 on card 220. Card 210 comprises connector 214, which is coupled to connector 223 on card 220.

In addition to connectors 222 and 223, card 220 comprises connectors 224, 225, 226, and 227. Each of these connectors is coupled, via cables, to corresponding connectors in drive array 280. Specifically, cable 232 couples connector 224 to connector 242, cable 234 couples connector 225 to connector 262, cable 236 couples connector 226 to connector 244, and cable 238 couples connector 227 to connector 264. When the cables are properly configured, the server system writes odd rows to persistent storage in the drive array via cables 232 and 236. Even rows are written via cables 234 and 238.

On the backend, card 240 comprises connector 246, which is coupled to connector 252 of card 250. Card 260 comprises connector 266, which is coupled to connector 272 of card 270. As explained further below, the diagnostic signal is routed through connectors 252 and 272 during the test process. Routing the signal through these connectors allows BIST circuit 202 to determine whether cards 250 and 270 are properly connected, in addition to the cables. In other embodiments, the route may loop back on cards 240 and 260 without passing through connectors 252 and 272.

During the diagnostic test, a diagnostic signal is generated by one of BIST circuits 202 or 212 on the diag_wrap_out bus. The signal is sent over the bus, through the Cxx pin of corresponding connectors (connectors 204 and 214) to pin B21 of connector 226. The signal is then routed as follows:
Cable 236 to A21 of connector 244,
A21 of connector 244 to A15 of connector 246;
A15 of connector 246 to A15 of connector 252;
A15 of connector 252 to A11 of connector 252;
A11 of connector 252 to A11 of connector 246;
A11 of connector 246 to A20 of connector 242;
A20 of connector 242 to B20 of connector 224;
B20 of connector 224 to B20 of connector 225;
B20 of connector 225 to A20 of connector 262;
A20 of connector 262 to A11 of connector 266;
A11 of connector 266 to A11 of connector 272;
A11 of connector 272 to A15 of connector 272;
A15 of connector 272 to A15 of connector 266;
A15 of connector 266 to A21 of connector 264;
A21 of connector 264 to B21 of connector 227;
B21 of connector 227 to B19 of connector 227;
B19 of connector 227 to A19 of connector 264;
A19 of connector 264 to A19 of connector 262;
A19 of connector 262 to B19 of connector 225; and
B19 of connector 225 to Dxx of connectors 222 and 223.
The diagnostic signal thus wraps around each of the connectors and cables until the signal is returned to the BIST circuit that sent the signal.

Figure 3:
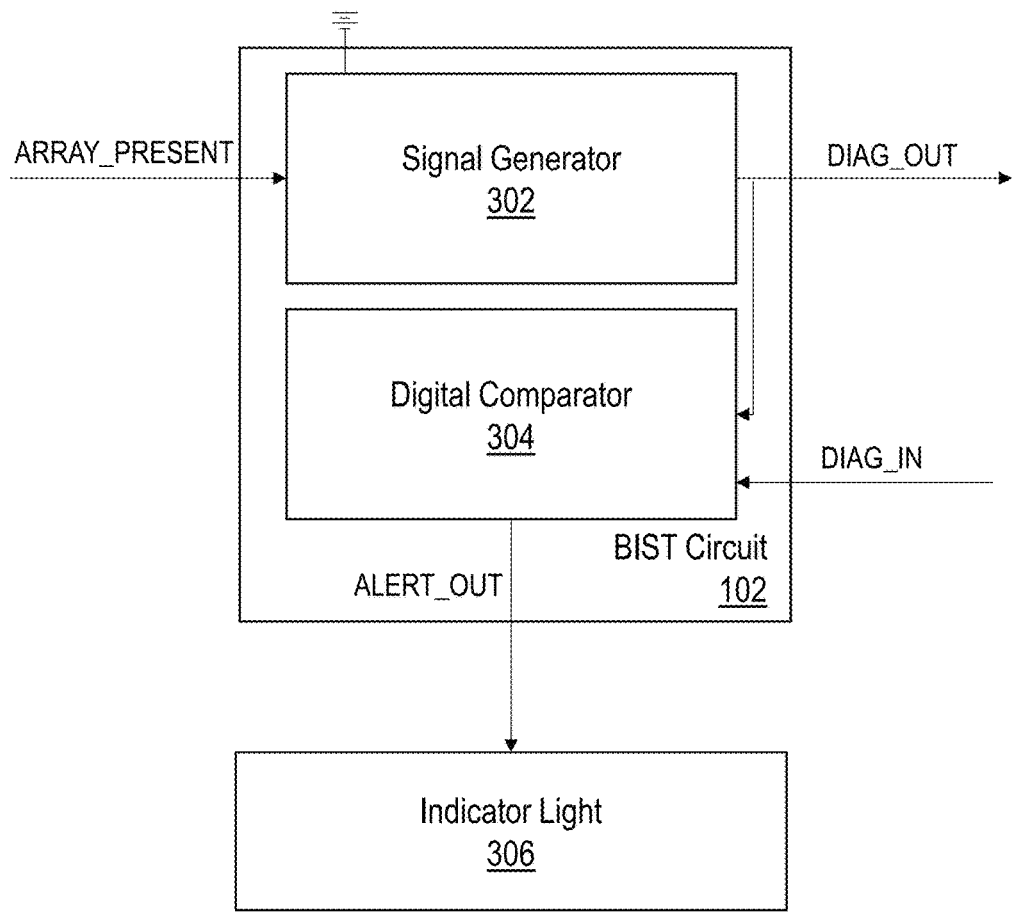
FIG. 3 illustrates components of an example test circuit according to one or more embodiments.

In one or more embodiments, the test circuit is implemented in hardware. FIG. 3 illustrates components of an example test circuit according to one or more embodiments. BIST circuit 102 comprises signal generator 302 and digital comparator 304. The components of BIST 102 may be implemented on reconfigurable hardware, such as on a field-programmable gate array (FPGA) and/or using discrete electronic components, such as switches, resistors, capacitors, etc.

Signal generator 302 comprises a switch (or switched circuit) coupled to a power source to drive DIAG_OUT high or low. Example switches that may be used may include, but are not limited to, metal-oxide field-effect transistors (MOSFETS), bipolar junction transistors (BJTs), push-button switches, and throw switches. In one or more embodiments, ARRAY_PRESENT is coupled to a switch control (e.g., the gate of a MOSFET) within signal generator 302. When the presence of the cables is detected, then signal generator 302 starts to sequence through a diagnostic pattern. The switch may be periodically opened and closed at predetermined intervals to drive DIAG_OUT high and low. In other embodiments, the test may be started manually, such as by the push of a button or the flip of a switch, or controlled via software.

Digital comparator 304 is coupled to two input bus lines carrying DIAG_OUT and DIAG_IN. Digital comparator 304 is configured to compare the diagnostic signal DIAG_OUT with the return signal DIAG_IN. Digital comparator 304 may be implemented using an XOR gate, an XNOR gate, a voltage comparator, or any other logic gates that changes the output signal based on whether the input signals match. The output of digital comparator 304 is ALERT_OUT, which is coupled to indicator light 306.

In one or more embodiments, ALERT_OUT causes indicator light 306 to turn on or off based on whether the return signal matches the diagnostic signal. For example, the light may be illuminated when the signals do not match to indicate that a cable is misconnected. In other embodiments, the color of indicator light 306 may differ based on whether the cables are correctly coupled or not. For example, indicator light 306 may be illuminated green when ALERT_OUT indicates that the cables are correctly arranged. On the other hand, the indicator light may be illuminated red when a misconnection is detected. Thus, indicator light 306 may be used to provide near instantaneous feedback of whether the cables are properly connected.

Additionally or alternatively, the output signal ALERT_OUT may be coupled to other components. For example, the signal may be coupled to an audio component to generate an audible alarm if the cables are incorrectly coupled. As another example, the ALERT_OUT signal may be returned to an application executing on the server system or some other host. The application may display a warning via a graphical user interface (GUI) to indicate that a misconnected cable has been detected. In yet another embodiment, the ALERT_OUT signal may trigger a warning message to be displayed on a panel of the server appliance and/or the drive array. Thus, the feedback used to notify a user of a misconnection may vary depending on the particular implementation.

3. Diagnostic Test Process

As previously indicated, BIST circuit 102 may sequence through a diagnostic pattern during the test process. The sequence may alternate between driving the DIAG_OUT low and high. The process may monitor the DIAG_IN signal to determine whether there is a corresponding change. If not, then BIST circuit 102 may generate an alert to indicate that one or more cables are misconnected.

Figure 4:
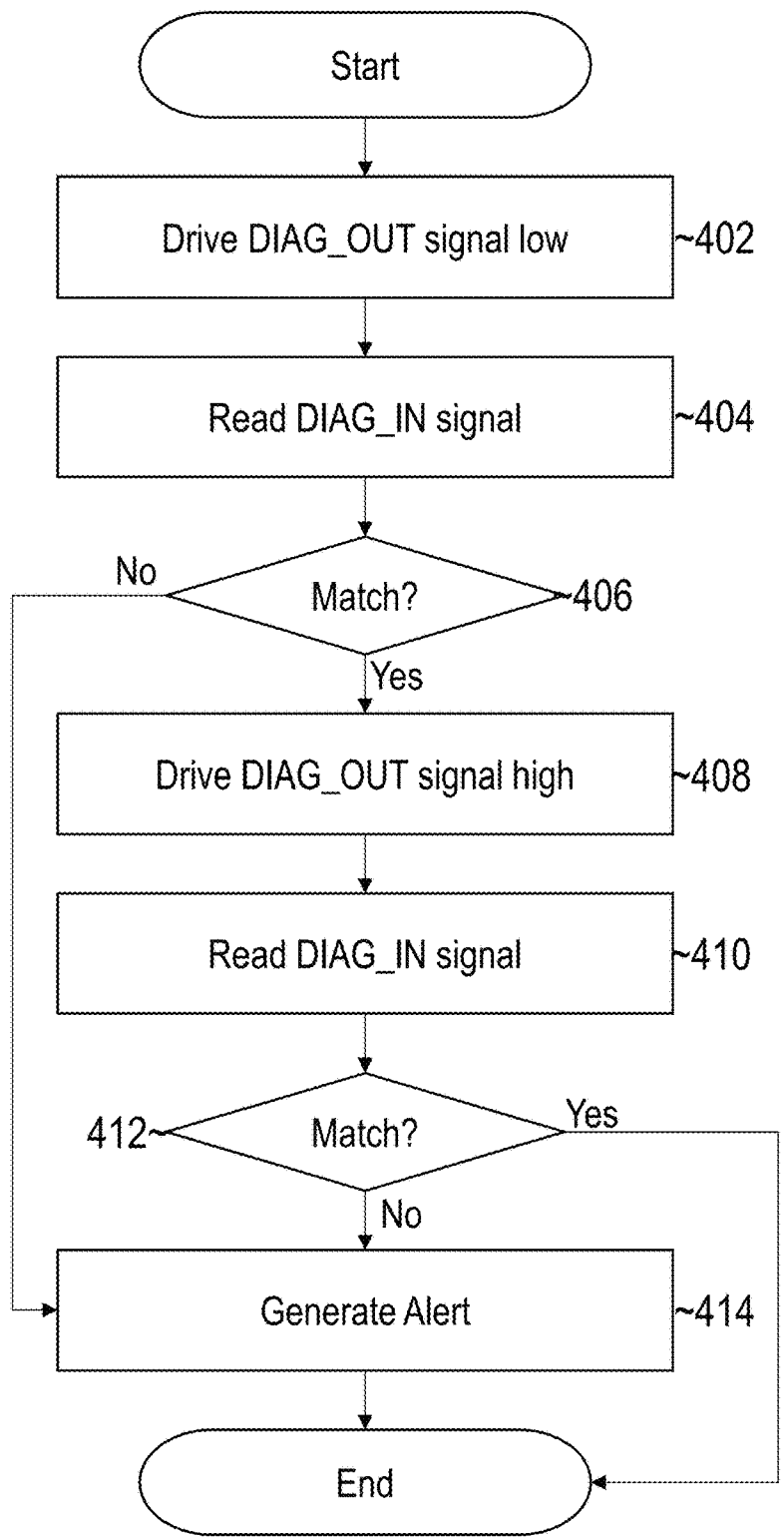
FIG. 4 illustrates a test process for detecting misconnected cables according to one or more embodiments.

FIG. 4 illustrates a test process for detecting misconnected cables according to one or more embodiments. The diagnostic test begins by driving the DIAG_OUT signal low (Operation 402). For example signal generator 302 may connect DIAG_OUT to ground using a switch to drive the signal low.

After the DIAG_OUT bus line has been driven low, the test process reads the return signal DIAG_IN (Operation 404). For example, the values of DIAG_OUT and DIAG_IN may be loaded into registers, gated latches, or otherwise input into digital comparator 304.

The test process next determines whether the DIAG_OUT signal and the DIAG_IN signal match (Operation 406). For example, an XOR operation may be performed by digital comparator 304. In this case, DIAG_OUT is approximately zero as the bus is connected to ground. If the DIAG_IN is also zero, then ALERT_OUT is maintained at zero. Otherwise, ALERT_OUT is driven high (e.g., by a connected DC voltage source) to indicate that the return signal does not match the original diagnostic signal.

If the return signal is high when the diagnostic signal is driven low, then the process jumps to Operation 414 to generate an alert. Conversely, if the diagnostic and return signal are both low, then the diagnostic test continues by driving DIAG_OUT high (Operation 408). For example, signal generator 302 may connect a switch to a power source to change the signal from low to high.

After the DIAG_OUT bus line has been driven high, the test process reads the return signal DIAG_IN (Operation 410). As before, the values of DIAG_OUT and DIAG_IN may be loaded into registers, gated latches, or otherwise input into digital comparator 304.

The test process next determines whether the DIAG_OUT signal and the DIAG_IN signal match (Operation 412). For example, another XOR operation may be performed by digital comparator 304. In this case, DIAG_OUT is high as the bus is connected to a DC voltage source. If the DIAG_IN is also high, then ALERT_OUT is maintained at zero. Otherwise, ALERT_OUT is driven high to indicate that the return signal does not match the original diagnostic signal.

If DIAG_OUT and DIAG_IN do not match, then an alert is generated (Operation 414). For example, digital comparator 304 may drive the bus for ALERT_OUT high. The alert signal may cause indicator light 306 to be illuminated and/or other visual feedback to be generated as previously described.

Although the example illustrated in FIG. 4 drives DIAG_OUT low first, in other embodiments, signal generator 302 may initiate the diagnostic test by driving the DIAG_OUT bus high. Thus, operations 408 to 412 may occur before operations 402 to 406.

In one or more embodiments, multiple test circuits may be deployed to test different subsets of cables. For example, drive array 280 may comprise other drives (not illustrated) with four cables to connect each drive in the array. In this case, different test circuits may be used to test different sets of cables for each drive. Different indicator lights and/or other visual indicators may be used to provide separate feedback for each subset of cables. This allows users to more easily isolate the misconnection.

In embodiments where redundant test circuits are used, a time-delay may be applied for different cards to prevent conflicts. For instance, BIST circuit 202 may initiate a first diagnostic test. Once the diagnostic test initiated by BIST circuit 202 is complete, BIST circuit 212 may perform a separate diagnostic test. An alert may be generated if either of the tests fail.

4. Example Missconnections

When a cable is misconnected, the route of the diagnostic signal does not return to the point of origin (i.e., the test circuit). By selectively grounding connector pins and/or leaving pins open, disconnected or swapped connections cause the return signal to be tied high or low, regardless of the diagnostic signal output by BIST circuit 102. As a result, when the diagnostic signal is changed from high to low, or vice versa, the return signal does not change. In response, the test circuit generates an alert to notify a user.

Figure 5A:
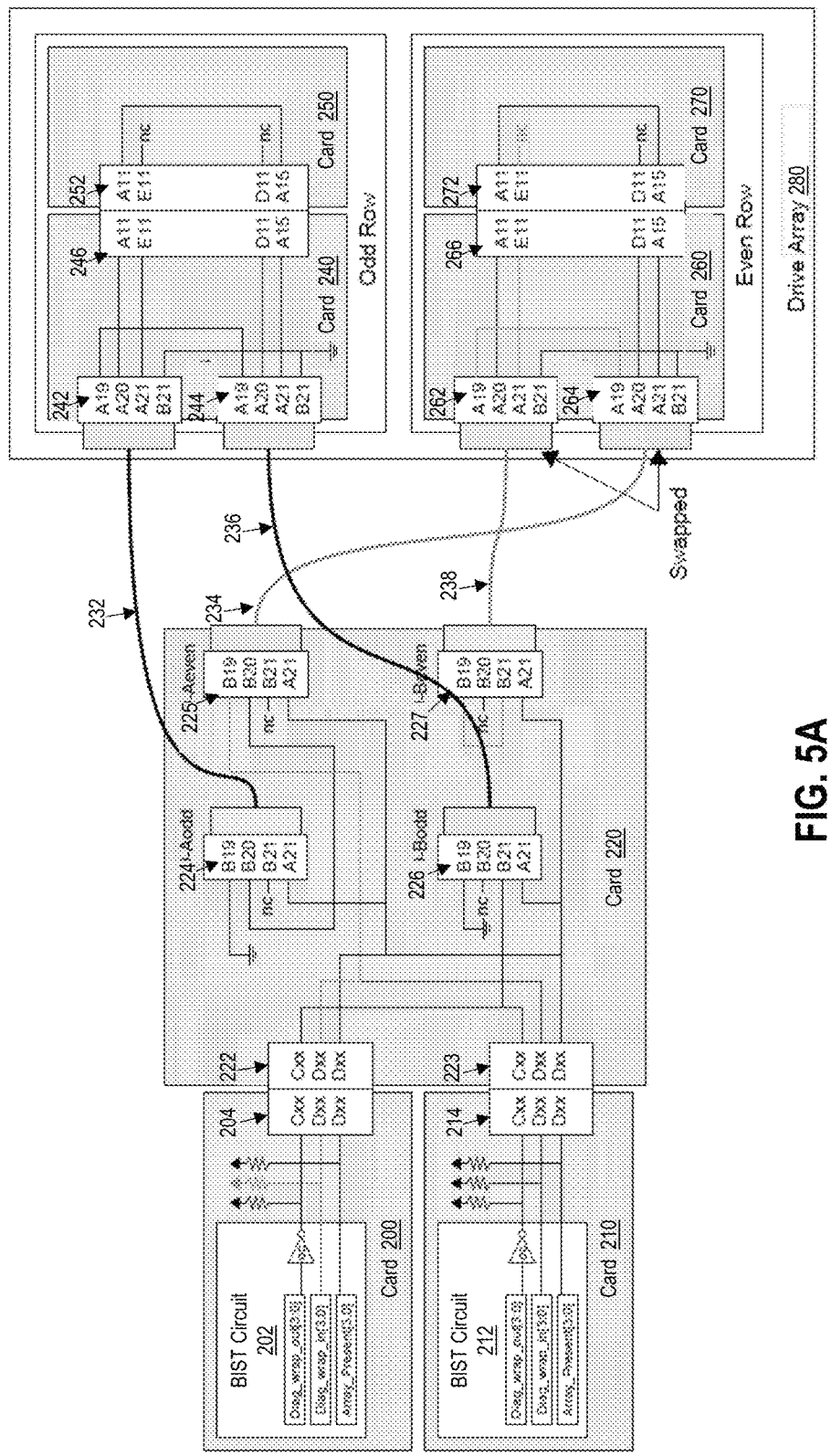
FIG. 5A illustrates an example scenario where a misconnection is detected according to one or more embodiments.

FIG. 5A illustrates an example scenario where a misconnection is detected according to one or more embodiments. In this example, the connections to card 260 for cable 234 and cable 238 have been swapped from the previous arrangement depicted in FIG. 2. In this case, the receive signal, diag_wrap_in, originates at an open/unconnected pin. Traversing backwards from the return signal, the path is as follows:

Dxx from connector 204 or 214 to Dxx on connector 222 or 223, respectively;
Dxx on connector 222 or 223 to B19 on connector 225;
B19 on connector 225 to A19 on connector 264;
A19 on connector 264 to A19 on connector 262;
A19 on connector 262 to B19 on connector 227;
B19 on connector 227 to B21 on connector 227;
B21 on connector 227 to A21 on connector 262;
A21 on connector 262 to E11 on connector 266; and
E11 on connector 266 to E11 on connector 272.

As can be seen, pin E11 of connector 272 is not connected. Thus, the pull-up resistor ties the return signal high, even when BIST circuit 202 or 212 drives the diagnostic signal low. The path of the diagnostic signal also does not form a full loop back to the test circuit. Rather, the path of the diagnostic signal ends at D11 on connector 272, which is not connected.

Figure 5B:
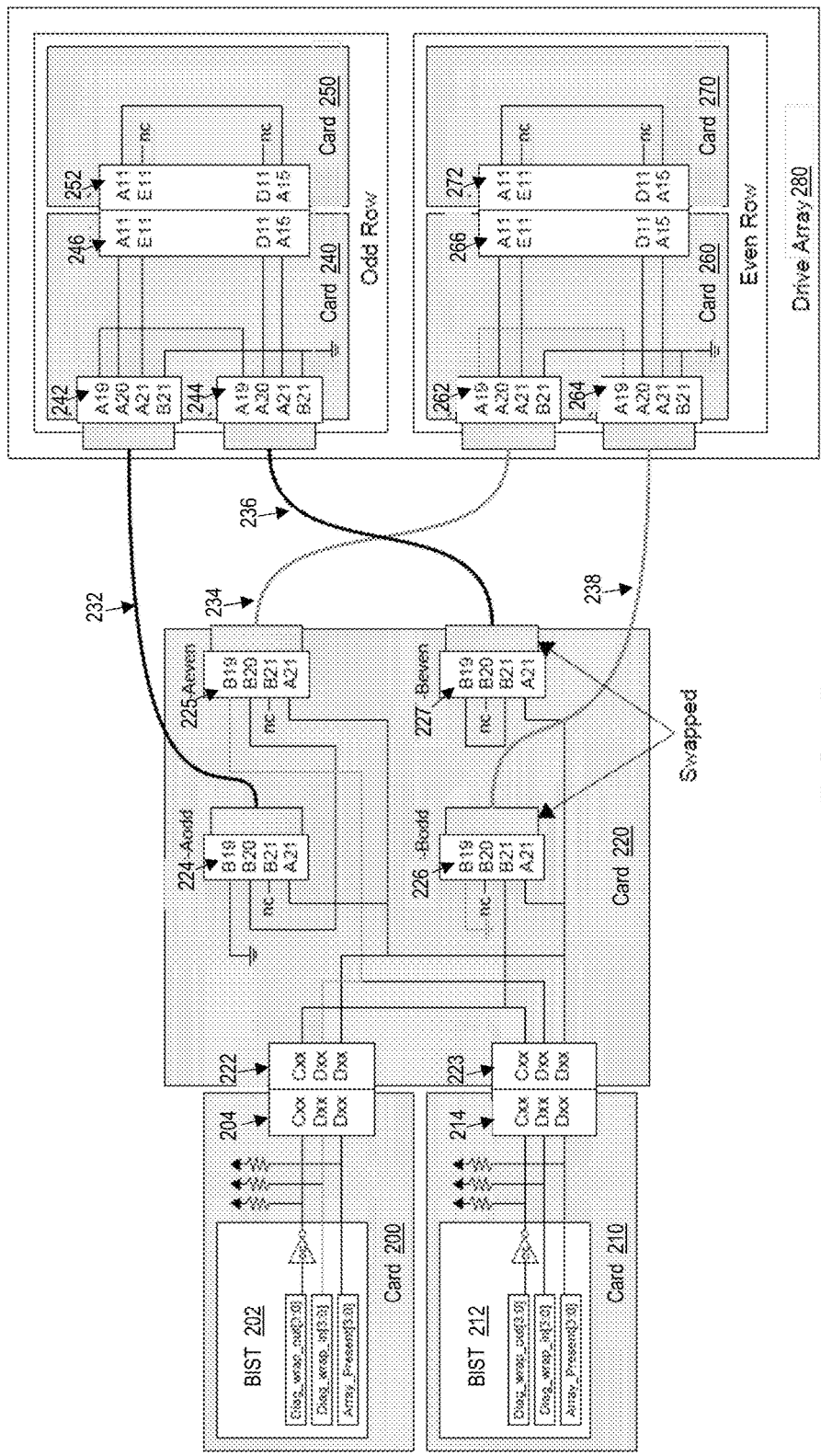
FIG. 5B illustrates another example scenario where a misconnection is detected according to one or more embodiments.

FIG. 5B illustrates another example scenario where a misconnection is detected according to one or more embodiments. In this example, the connections at card 220 for cable 236 and 238 have been swapped from the previous arrangement depicted in FIG. 2. In this case, the receive signal, diag_wrap_in, originates at a grounded pin. Traversing backwards from the return signal, the path is as follows:

Dxx from connector 204 or 214 to Dxx on connector 222 or 223, respectively;
Dxx on connector 222 or 223 to B19 on connector 225;
B19 on connector 225 to A19 on connector 262;
A19 on connector 262 to A19 on connector 264; and
A19 on connector 264 to B19 on connector 226;

As can be seen, pin B19 of connector 226 is connected to ground. Thus, the return signal can never be driven high, even when BIST circuit 202 or 212 drive the diagnostic signal high. The path of the diagnostic signal does not form a full loop back to the test circuit. Rather the path of the diagnostic signal ends at B19 of connector 224, which is also connected to ground.

In the above examples, the type of error may be determined based on whether the return signal is stuck high or low. When the return signal was stuck high, the connections at card 260 were swapped. When the connections were stuck low, the connections at card 220 were swapped. In one or more embodiments, the test circuit may determine the type of error based on which diagnostic signal is being sent and the return signal. The type of error may be captured and reported via the state of the alert signal. For example, the alert signal may have a first value if the return signal is stuck high and a second value if the return signal is stuck low.

In one or more embodiments, the type of error may be used to generate and display error reports. For instance, the value of the alert signal may be used to determine which connectors have a misconnected cable. Responsive to the alert signal, a display panel or other GUI may present a connector identifier or set of identifiers to isolate the misconnection to one or more connectors. This process helps users quickly identify and correct the source of the misconnection alert.

5. Computer Implementations

According to one embodiment, the techniques for driving the diagnostic tests are implemented by one or more special-purpose computing devices. The special-purpose computing devices may be hard-wired to perform the techniques, or may include digital electronic devices such as one or more application-specific integrated circuits (ASICs) or FPGAs that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 6:
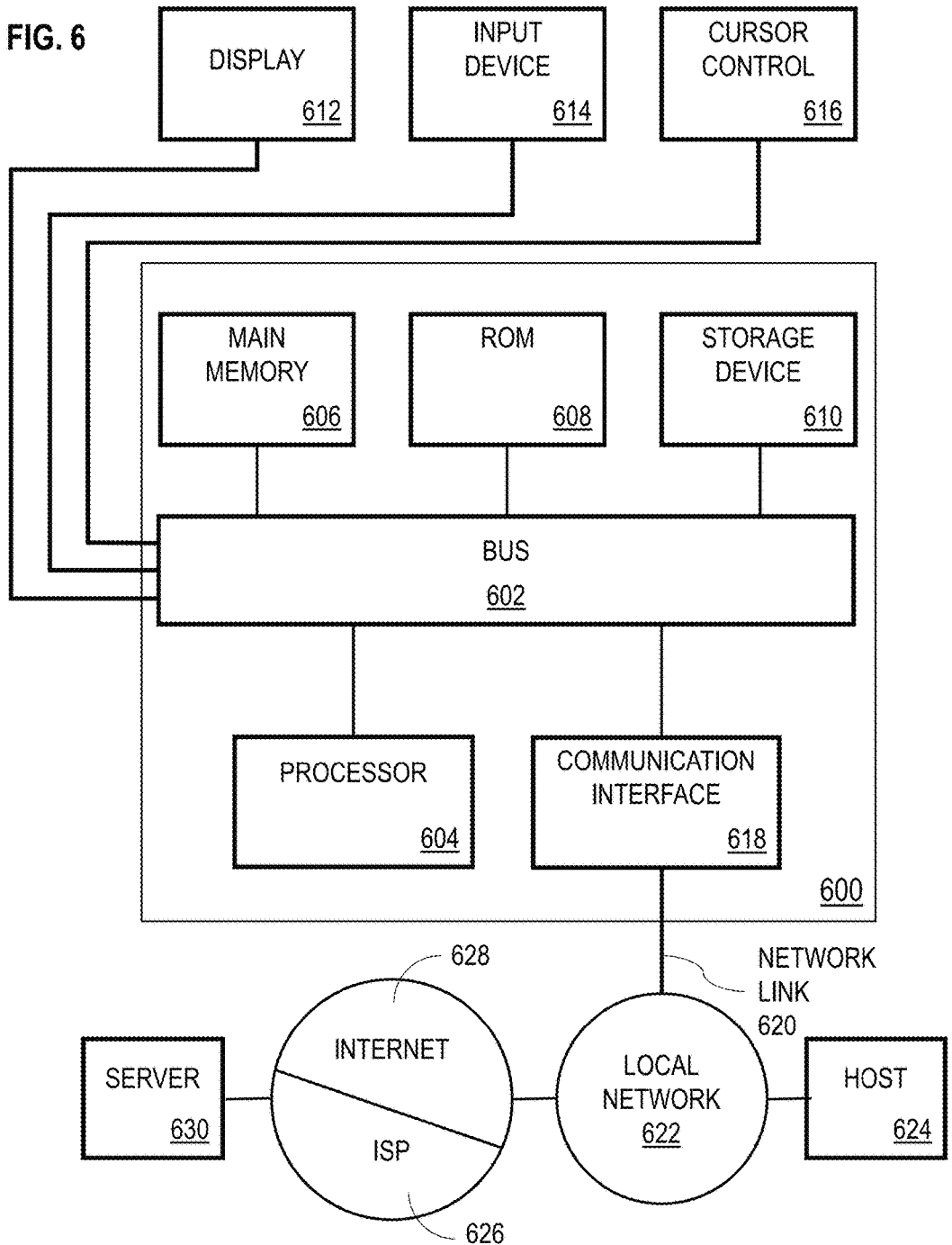
FIG. 6 illustrates an example computer system upon which one or more embodiments may be implemented.

For example, FIG. 6 is a block diagram that illustrates computer system 600 upon which one or more embodiments may be implemented. Computer system 600 includes bus 602 or other communication mechanism for communicating information, and hardware processor 604 coupled with bus 602 for processing information. Hardware processor 604 may be, for example, a general purpose microprocessor.

Computer system 600 also includes main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Such instructions, when stored in non-transitory storage media accessible to processor 604, render computer system 600 into a special-purpose machine that is customized to perform the operations specified in the instructions.

Computer system 600 further includes read only memory (ROM) 608 or other static storage device coupled to bus 602 for storing static information and instructions for processor 604. Storage device 610, such as a magnetic disk or optical disk, is provided and coupled to bus 602 for storing information and instructions.

Computer system 600 may be coupled via bus 602 to display 612, such as a cathode ray tube (CRT), liquid crystal display (LCD), or light-emitting diode (LED), for displaying information to a computer user. Input device 614, which may include physical and/or touchscreen based alphanumeric keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 610. Volatile media includes dynamic memory, such as main memory 606. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to local network 622. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to host computer 624 or to data equipment operated by Internet Service Provider (ISP) 626. ISP 626 in turn provides data communication services through the world wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are example forms of transmission media.

Computer system 600 can send messages and receive data, including program code, through the network(s), network link 620 and communication interface 618. In the Internet example, server 630 might transmit a requested code for an application program through Internet 628, ISP 626, local network 622 and communication interface 618.

The received code may be executed by processor 604 as it is received, and/or stored in storage device 610, or other non-volatile storage for later execution.

6. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method for automatically detecting misconnections among a plurality of cables, wherein the plurality of cable includes three or more cables, the method comprising: sending, by a test circuit, a first sequence of signals through a first pin of a first connector that is coupled to a first cable of the plurality of cables; monitoring, by the test circuit, a second pin of a second connector that is coupled to a second cable of the plurality of cables to detect a second sequence of signals is detected on the second pin of the second connector; comparing, by the test circuit, the first sequence of signals with the second sequence of signals to determine whether the first sequence of signals was successfully routed through a path that includes each cable of the plurality of cables and a plurality of connectors, wherein the path further includes one or more loop-back traces that connect pins from different connectors of the plurality of connectors such that, when the plurality of cables are correctly connected, the first sequence of signals is returned from a particular device to the test circuit over a different cable than a cable through which the particular device received the first sequence of signals from the test circuit; determining, by the test circuit based on comparing the first sequence of signals and the second sequence of signals, that two or more cables of the plurality of cables are swapped into wrong connectors of the plurality of connectors; responsive to determining that the two or more cables of the plurality of cables are swapped into wrong connectors of the plurality of connectors, generating an alert signal to indicate that the two or more cables of the plurality of cables are misconnected.

2. The method of claim 1, further comprising determining which cables of the plurality of cables are swapped based on the second sequence of signals, wherein the second pin is coupled to a pull-up resistor that drives the second pin high when a first pair of cables are swapped into wrong connectors, wherein the second pin is coupled to ground that drives the second pin low when a second pair of cables are swapped into wrong connectors.

3. The method of claim 1, further comprising determining a type of error based on the second sequence of signals detected on the second pin of the second connector.

4. The method of claim 1, wherein the plurality of cables are a subset of cables in a system; and wherein the first sequence of signals is sent by the test circuit during assembly of the system.

5. The method of claim 1, wherein sending the first sequence of signals through the first pin of the first connector comprises switching the first pin between high and low; wherein the alert signal is generated responsive to detecting that there is no change on the second pin.

6. The method of claim 1, wherein the plurality of cables are connected to a plurality of connectors including two or more different connectors of the plurality of connectors that have one or more pins coupled between the two or more different connectors such that the first sequence of signals is routed through each cable of the plurality of cables when the cables are correctly connected.

7. The method of claim 1, wherein the alert signal causes an indicator light to be illuminated.

8. The method of claim 1, wherein the first connector and the second connector are on a single card.

9. The method of claim 1, wherein the first sequence of signals is generated automatically upon detecting that at least one cable ii the first cable and the second cable are present.

10. A system for automatically detecting misconnections among a plurality of cables, wherein the plurality of cable includes three or more cables, the system comprising:
a signal generator coupled to a first pin of a first connector for a first cable of the plurality of cables;
a comparator coupled to a plurality of input lines including a first line for carrying a first sequence of signals output by the signal generator and a second input line for carrying a second sequence of signals received from a second pin of a second connector for a second cable of the plurality of cables;
wherein the comparator compares the first sequence of signals with the second sequence of signals to determine whether the first sequence of signals was successfully routed through a path that includes each cable of the plurality of cables and a plurality of connectors, wherein the path further includes one or more loop-back traces that connect pins from different connectors of the plurality of connectors such that, when the plurality of cables are correctly connected, the first sequence of signals is returned from a particular device to the system over a different cable than a cable through which the particular device received the first sequence of signals from the system;
wherein the comparator is further coupled to an output line that is driven high or low based on comparing the first sequence of signals with second sequence of signals when the second sequence of signals does not match the first sequence of signals and follows a particular sequence caused by two or more cables of the plurality of cables being swapped into wrong connectors of the plurality of connectors.

11. The system of claim 10, wherein the signal generator comprises a switched circuit for sequentially driving the first pin low then high or high then low.

12. The system of claim 10, the system further comprising a pull-up resistor with a first terminal coupled to a power rail and a second terminal coupled between the comparator and the second pin such that the comparator reads a high value when the second pin is coupled to an open connection through at least the second cable.

13. The system of claim 10, wherein the comparator reads a low value when the second pin is coupled to ground through at least the second cable.

14. The system of claim 10, the system further comprising an indicator light coupled to the comparator such that the indicator light is illuminated when the comparator generates an alert signal on the output line.

15. The system of claim 10, wherein the first connector and the second connector are on a single card.

16. The system of claim 10, wherein the signal generator generates a diagnostic signal automatically upon detecting at least the first cable and the second cable are present.

17. The system of claim 10, wherein the first connector and the second connector are couplable to serial attached small computer system interface cables.

18. A system for automatically detecting misconnections among a plurality of cables, wherein the plurality of cable includes three or more cables, the system comprising: means for sending a first sequence of signals through a first pin of a first connector that is coupled to a test circuit and a first cable of the plurality of cables; means for monitoring a second pin of a second connector that is coupled to a second cable of the plurality of cables to detect a second sequence of signals on the second pin of the second connector; means for comparing, by the test circuit, the first sequence of signals with the second sequence of signals to determine whether the first sequence of signals was successfully routed through a path that includes each cable of the plurality of cables and a plurality of connectors, wherein the path further includes one or more loop-back traces that connect pins from different connectors of the plurality of connectors such that, when the plurality of cables are correctly connected, the first sequence of signals is returned from a particular device to the test circuit over a different cable than a cable through which the particular device received the first sequence of signals from the test circuit; means for determining, by the test circuit based on comparing the first sequence of signals and the second sequence of signals, that two or more cables of the plurality of cables are swapped into wrong connectors of the plurality of connectors; means for responsive to determining that the signal is not detected on the second pin two or more cables of the plurality of cables are swapped into wrong connectors of the plurality of connectors, generating an alert signal to indicate that the two or more cables of the plurality of cables are misconnected; and means for indicating a type of misconnection based upon the second sequence of signals detected on the second pin of the second connector as compared to the signal sent through the first pin of the first connector that is coupled to the first cable of the plurality of cables.

* * * * *

UNITED STATES PATENT AND TRADEMARK OFFICE
CERTIFICATE OF CORRECTION

PATENT NO.         : 10,199,773 B2                                    Page 1 of 1
APPLICATION NO.    : 15/643195
DATED              : February 5, 2019
INVENTOR(S)        : Buhlman et al.

It is certified that error appears in the above-identified patent and that said Letters Patent is hereby corrected as shown below:

In the Specification

In Column 3, Line 60, delete "signals" and insert -- signals. --, therefor.

In Column 8, Line 19, delete "Missconnections" and insert -- Misconnections --, therefor.

In Column 8, Line 67, delete "226;" and insert -- 226. --, therefor.

In the Claims

In Column 12, Line 8, in Claim 1, delete "cable" and insert -- cables --, therefor.

In Column 12, Line 16, in Claim 1, after "signals" delete "is detected".

In Column 13, Line 3, in Claim 9, after "least" delete "one cable ii".

In Column 13, Line 6, in Claim 10, delete "cable" and insert -- cables --, therefor.

In Column 14, Line 38, in Claim 18, after "that the" delete "signal is not detected on the second pin".

In Column 14, Line 14, in Claim 18, delete "cable" and insert -- cables --, therefor.

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*